(12) United States Patent
Agan et al.

(10) Patent No.: US 8,976,577 B2
(45) Date of Patent: Mar. 10, 2015

(54) HIGH DENSITY MAGNETIC RANDOM ACCESS MEMORY

(76) Inventors: Tom A. Agan, Maple Grove, MN (US); Alexander Mikhailovich Shukh, Savage, MN (US)

(*) Notice: Subject to any disclaimer, the term of this patent is extended or adjusted under 35 U.S.C. 154(b) by 394 days.

(21) Appl. No.: 13/554,467

(22) Filed: Jul. 20, 2012

(65) Prior Publication Data
US 2012/0281465 A1 Nov. 8, 2012

Related U.S. Application Data

(63) Continuation-in-part of application No. 13/441,841, filed on Apr. 7, 2012.

(60) Provisional application No. 61/472,788, filed on Apr. 7, 2011.

(51) Int. Cl.
G11C 11/00 (2006.01)
G11C 11/16 (2006.01)

(52) U.S. Cl.
CPC ........... *G11C 11/161* (2013.01); *Y10S 977/933* (2013.01); *Y10S 977/935* (2013.01)
USPC ........... 365/158; 365/148; 365/171; 977/933; 977/935

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, E21.665; 438/3; 977/933–935
See application file for complete search history.

(56) References Cited

U.S. PATENT DOCUMENTS

| 5,640,343 | A | 6/1997 | Gallagher et al. |
| 6,211,090 | B1 | 4/2001 | Durlam et al. |
| 6,256,223 | B1 | 7/2001 | Sun |
| 6,269,018 | B1 | 7/2001 | Monsma et al. |
| 6,363,000 | B2 | 3/2002 | Perner et al. |
| 6,801,451 | B2 | 10/2004 | Tran et al. |
| 6,882,553 | B2 | 4/2005 | Nejad et al. |
| 6,950,333 | B2 | 9/2005 | Hiramoto et al. |
| 7,006,375 | B2 | 2/2006 | Covington |
| 7,224,601 | B2 | 5/2007 | Panchula |

(Continued)

OTHER PUBLICATIONS

X. Zhu and J.-G. Zhu, IEEE Trans.Magn., v.42, p. 2739-2741 (2006).

(Continued)

*Primary Examiner* — Harry W Byrne

(57) ABSTRACT

One embodiment of a magnetic memory device comprises a substrate and a plurality of planar memory arrays stacked on the substrate, each memory array includes a plurality of parallel first conductive lines, each first conductive line includes a ferromagnetic cladding, a plurality of parallel second conductive lines overlapping the first conductive lines at a plurality of intersection regions, a plurality of magnetic tunnel junctions, each magnetic tunnel junction has a controllable electrical resistance, is disposed at an intersection region and electrically coupled to one of the first conductive lines at its first end and to one of the second conductive lines at its second end. The electrical resistance of the magnetic tunnel junction is controlled by a joint effect of a spin-polarized current running between the first and second ends and a bias magnetic field applied simultaneously to said each magnetic tunnel junction. Other embodiments are described and shown.

20 Claims, 15 Drawing Sheets

(56) References Cited

U.S. PATENT DOCUMENTS

| | | | |
|---|---|---|---|
| 7,313,013 B2 | 12/2007 | Sun et al. | |
| 7,411,817 B2 | 8/2008 | Nozieres et al. | |
| 7,432,574 B2 | 10/2008 | Nakamura et al. | |
| 7,440,339 B2 | 10/2008 | Nejad et al. | |
| 7,471,550 B2 * | 12/2008 | Koga | 365/158 |
| 7,480,173 B2 * | 1/2009 | Guo et al. | 365/158 |
| 7,502,249 B1 * | 3/2009 | Ding | 365/158 |
| 7,508,042 B2 | 3/2009 | Guo | |
| 7,511,991 B2 | 3/2009 | Saito et al. | |
| 7,532,505 B1 | 5/2009 | Ding | |
| 7,545,672 B2 * | 6/2009 | Ueda et al. | 365/158 |
| 7,577,021 B2 * | 8/2009 | Guo et al. | 365/158 |
| 7,596,015 B2 * | 9/2009 | Kitagawa et al. | 365/158 |
| 7,652,913 B2 * | 1/2010 | Sugiyama et al. | 365/158 |
| 7,668,005 B2 * | 2/2010 | Ueda | 365/158 |
| 7,742,328 B2 * | 6/2010 | Chen et al. | 365/158 |
| 7,755,932 B2 * | 7/2010 | Ito et al. | 365/158 |
| 7,869,265 B2 | 1/2011 | Shimizu et al. | |
| 7,924,607 B2 | 4/2011 | Yoshikawa et al. | |
| 8,036,010 B2 | 10/2011 | Maejima | |
| 8,149,606 B2 | 4/2012 | Maejima | |
| 8,164,940 B2 | 4/2012 | Ozatay et al. | |
| 2009/0103354 A1 | 4/2009 | Yoon et al. | |
| 2012/0107964 A1 | 5/2012 | Ranjan et al. | |

OTHER PUBLICATIONS

S. Mangin et al., Applied Physics Letters, v.94, 012502 (2009).
US 7,529,121, 5/2009, Kitagawa et al. (withdrawn).
X. Zhu and J.-G. Zhu, IEEE Trans.Magn., v.42 p. 2730-2741 (2006).
S. Mangin et al., Applied Physics Letters, v.94 012502 (2009).

* cited by examiner

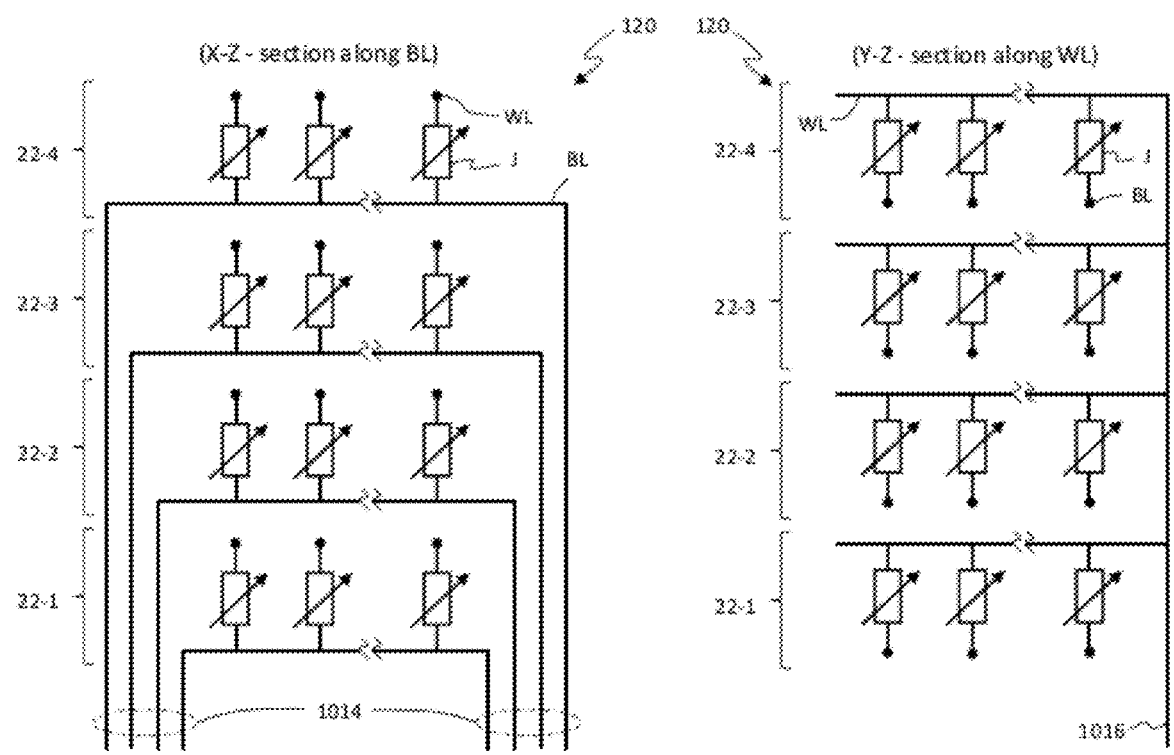
*Fig. 13A*  *Fig. 13B*

HIGH DENSITY MAGNETIC RANDOM ACCESS MEMORY

CROSS-REFERENCE TO RELATED APPLICATIONS

This application is a continuation-in-part of U.S. patent application Ser. No. 13/441,841, filed on Apr. 7, 2012 and claims the benefit of U.S. provisional patent application No. 61/472,788, filed on Apr. 7, 2011 by the present inventors.

FEDERALLY SPONSORED RESEARCH

Not Applicable.

SEQUENCE LISTING OR PROGRAM

Not Applicable.

RELEVANT PRIOR ART

U.S. Pat. No. 5,640,343, Jun. 17, 1997—Gallagher et al.
U.S. Pat. No. 7,224,601, May 29, 2007—Panchula
U.S. Pat. No. 7,529,121, May 5, 2009—Kitagawa et al.
U.S. Pat. No. 7,440,339, Oct. 21, 2009—Nejad et al.

BACKGROUND

A magnetic random access memory (MRAM) using spin-induced switching is a strong candidate for providing a dense and fast non-volatile storage solution for future memory applications. An MRAM includes an array of memory cells arranged in rows and columns. FIG. 1 shows a schematic view of an MRAM cell employing a spin-induced writing mechanism according to a prior art. The cell comprises a magnetoresistive element (or a magnetic tunnel junction) J, a selection transistor T, a bit line BL, a word line WL, and a source line SL. The bit and word lines are formed in different layers and intersect each other in space. The magnetoresistive (MR) element J and the selection transistor T are connected in series and disposed in a vertical space between the intersecting bit and word lines. They are connected to the source line SL at one end and to the bit line BL at another end. The word line is connected to a gate terminal of the selection transistor T. The MR element J comprises at least a pinned (or reference) layer 12 with a fixed direction of magnetization (shown by a solid arrow), a free (or storage) layer 16 with a reversible magnetization direction (shown by a dashed arrow), and a tunnel barrier layer 14 disposed between the pinned and free magnetic layers. The direction of the magnetization in the free layer 16 can be controlled by a direction of a spin-polarized current $I_S$ running through the element J in a direction perpendicular to a film surface. The spin-polarized current $I_S$ in the MR element is reversible or bidirectional. A resistance of the MR element depends on a mutual orientation of the magnetizations in the magnetic layers 12 and 16. The resistance is low when the magnetization directions in the layers 12 and 16 are parallel to each other (logic "0"), and high when the magnetization directions are antiparallel (logic "1"). A difference in resistance between two magnetic states can exceed several hundred percent at room temperature.

FIG. 2 shows a circuit diagram of a portion of an MRAM 20 with spin-induced switching according to a prior art. The MRAM 20 includes an array 22 of memory cells C11-C33 (other cells are not shown) disposed in a vertical space between pluralities of parallel bits and parallel word lines at their intersections. Each memory cell comprises an MR element J and transistor T connected in series. A plurality of parallel bit lines BL1-BL3 is connected to a bit line driver 24. A plurality of the word lines WL1-WL3 is connected to a word line driver 26. A plurality of the parallel source lines SL1-SL3 is connected to a source line driver 28. Selection of a memory cell in the array 22 is provided by applying a suitable signal to appropriate bit and word lines. For instance, to select the memory cell C22 that is located at the intersection of the bit line BL2 and the word line WL2, the signals need to be applied to these lines through the drivers 24 and 26, respectively.

Cell size is one of the key parameters of MRAM. It substantially depends on the size and number of selection transistors supplying a spin-polarized write current to an MR element. The number of the transistors controlling the write current usually varies from one or two per MR element. It depends on the saturation current of the selection transistor and magnitude of the spin-polarized current required to cause switching of the MR element. Frequently, especially for MR elements having in-plane magnetization in the magnetic layers, one selection transistor cannot provide the required spin-polarized current due to its saturation. This obstacle prevents MRAM cell size reduction.

Another important parameter of the MRAM is a write speed. The write speed depends on the magnitude of the spin-polarized current running through the MR element. High speed (short duration of the write current pulse) requires higher magnitude of the spin-polarized current that can be limited by the saturation current of the selection transistor or by a breakdown of the tunnel barrier layer.

The present disclosure addresses to the above problems.

SUMMARY

In accordance with one embodiment a magnetic memory device comprises: a substrate and a stack of planar memory arrays disposed on a substrate surface, each memory array comprising a plurality of parallel first conductive lines, a plurality of parallel second conductive lines overlapping the first conductive lines at a plurality of intersection regions, a plurality of magnetic tunnel junctions, each magnetic tunnel junction being disposed at an intersection region, electrically coupled to one of the first conductive lines at a first terminal and to one of the second conductive lines at a second terminal, and comprising a controllable electrical resistance, wherein the electrical resistance of said each magnetic tunnel junction is controlled by a bidirectional spin-polarized current running between the first and second terminals in a direction perpendicular to the substrate surface.

In accordance with another embodiment a magnetic memory device comprises: a substrate and a plurality of planar memory arrays stacked on the substrate, each memory array comprising a plurality of parallel first conductive lines, each first conductive line comprising a ferromagnetic cladding, a plurality of parallel second conductive lines overlapping the first conductive lines at a plurality of intersection regions, a plurality of magnetic tunnel junctions, each magnetic tunnel junction comprising a controllable electrical resistance, being disposed at an intersection region and electrically coupled to one of the first parallel conductive lines at a first end and to one of the second parallel conductive lines at a second end, wherein the electrical resistance of said each magnetic tunnel junction is controlled by a joint effect of a magnetic field and a bidirectional spin-polarized current applied simultaneously to said each magnetic tunnel junction.

In accordance with yet another embodiment a magnetic memory device comprises: a substrate, a plurality of planar memory arrays vertically stacked on the substrate, each planar memory array comprising a plurality of parallel first conductive lines, a plurality of parallel second conductive lines overlapping the first conductive lines in a plurality of intersection regions, a plurality of magnetic tunnel junctions, each magnetic tunnel junction being disposed at an intersection region and comprising a free ferromagnetic layer having a reversible magnetization direction, a pinned ferromagnetic layer having a fixed magnetization direction, and a tunnel barrier layer disposed between the free ferromagnetic layer and the pinned ferromagnetic layer, said each magnetic tunnel junction being electrically coupled to one of the first conductive lines at a first terminal and to one of the second conductive lines at a second terminal; a circuitry area disposed on the substrate beneath the plurality of planar memory arrays and comprising an electrical circuitry; and a plurality of interconnects disposed adjacent to the circuitry area to provide an electrical coupling of the plurality of first conductive lines and the plurality of second conductive lines to the electrical circuitry, wherein an electrical resistance of said each magnetic tunnel junction depends on a mutual orientation of the magnetizations directions in the free and pinned ferromagnetic layers.

BRIEF DESCRIPTION OF THE DRAWINGS

FIGS. 13A and 13B illustrate a configuration of bit lines and word lines shared by cell arrays in a memory block shown in FIG. 12 and the relation between bit line interconnects and word line interconnects.

Figure 1:
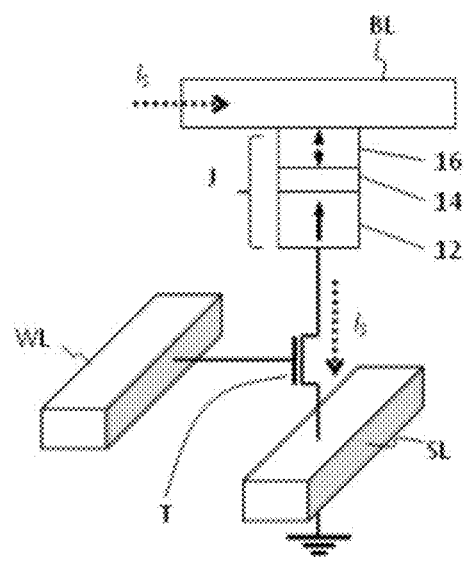
FIG. 1 is a schematic view of a memory cell with spin-induced switching according to a prior art.
Figure 2:
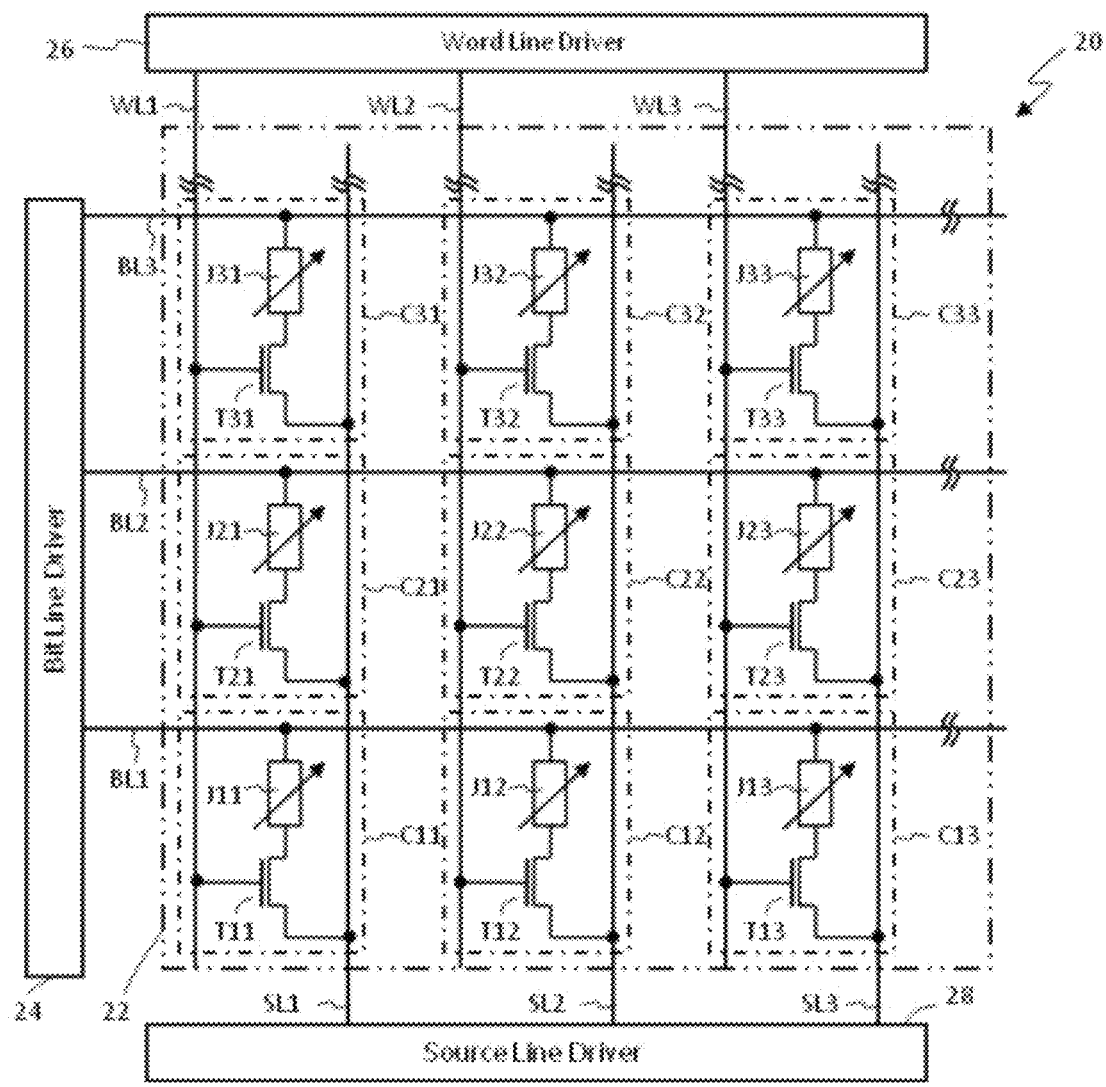
FIG. 2 is a circuit diagram of a magnetic random access memory with spin-induced switching according to a prior art.

EXPLANATION OF REFERENCE NUMERALS 12 pinned (or reference) magnetic layer
14 tunnel barrier layer
16 free (or storage) magnetic layer
20, 30, 60, 100, 120 magnetic random access memory (MRAM)
22 array of memory cells
24 bit line driver
26 word line driver
28 source line driver
52 conductor
54 magnetic flux concentrator
56 non-magnetic gap
1010 control circuitry area
1012 memory block
1014 bit line interconnects
1016 word line interconnects
1024 bit line interconnect contact area
1026 word line interconnect contact area
BL, BL1, BL2, BL3 bit line
C, C11-C33 memory cell
J, J11-J33 magnetic tunnel junction
SA1-SA3 sense amplifier
SL, SL1, SL2, SL3 source line
T, T11-T33 selection transistor
Tb1-Tb6 bit line transistor
Ts1-Ts3 read transistor
Tw1-Tw6 word line transistor
WL, WL1, WL2, WL3 word line

DETAILED DESCRIPTION

Embodiments of the present disclosure will be explained below with reference to the accompanying drawings. Note that in the following explanation the same reference numerals denote constituent elements having almost the same functions and arrangements, and a repetitive explanation will be made only when necessary.

Note also that each embodiment to be presented below merely discloses a device or method for embodying the technical idea of the present disclosure. Therefore, the technical idea of the present disclosure does not limit the materials, structures, arrangements, and the like of constituent parts to those described below. The technical idea of the present disclosure can be variously changed within the scope of the appended claims.

Figure 4:
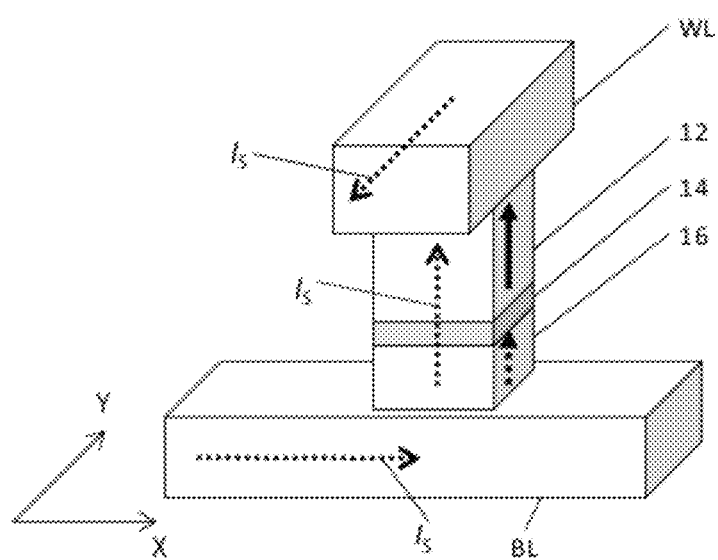
FIG. 4 is a schematic view of a memory cell with a spin-induced switching according to an embodiment of the present disclosure.
Figure 5:
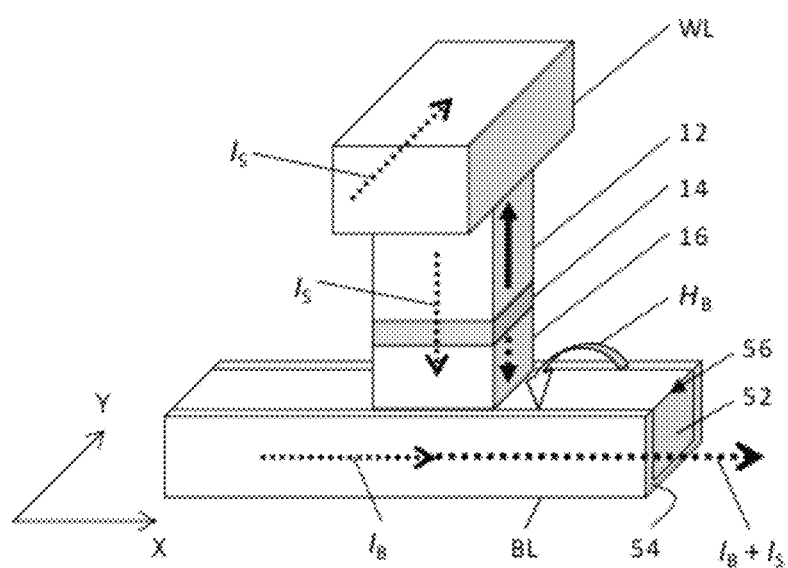
FIG. 5 is a schematic view of a memory cell with a hybrid switching mechanism.

Refer now to the drawings, FIG. 1, FIG. 4, and FIG. 5 which illustrate exemplary aspects of the MR element. Specifically, these figures illustrate the MR element having a multilayer structure with a perpendicular direction of magnetization in the magnetic layers. The direction (or orientation) of the magnetization in the magnetic layers are shown by solid or dashed arrows. The magnetization in the magnetic layers can be directed perpendicular or in-plane to surface of the magnetic layers. The MR element can store binary data by using steady logic states determined by mutual orientation of the magnetizations in the magnetic layers separated by a tunnel barrier layer. The logic state "0" or "1" of the MR element can be changed by a spin-polarized current running through the element in the direction across the tunnel barrier layer or perpendicular to a film surface.

The MR element herein mentioned in this specification and within the scope of the claims is a general term of a tunneling magnetoresistance (TMR) element using an insulator or semiconductor as the tunnel barrier layer. Although the above mentioned figures each illustrate the major components of the MR element, another layer (or layers) such as a seed layer, a pinning layer, a cap layer, and others may also be included.

Figure 3A:
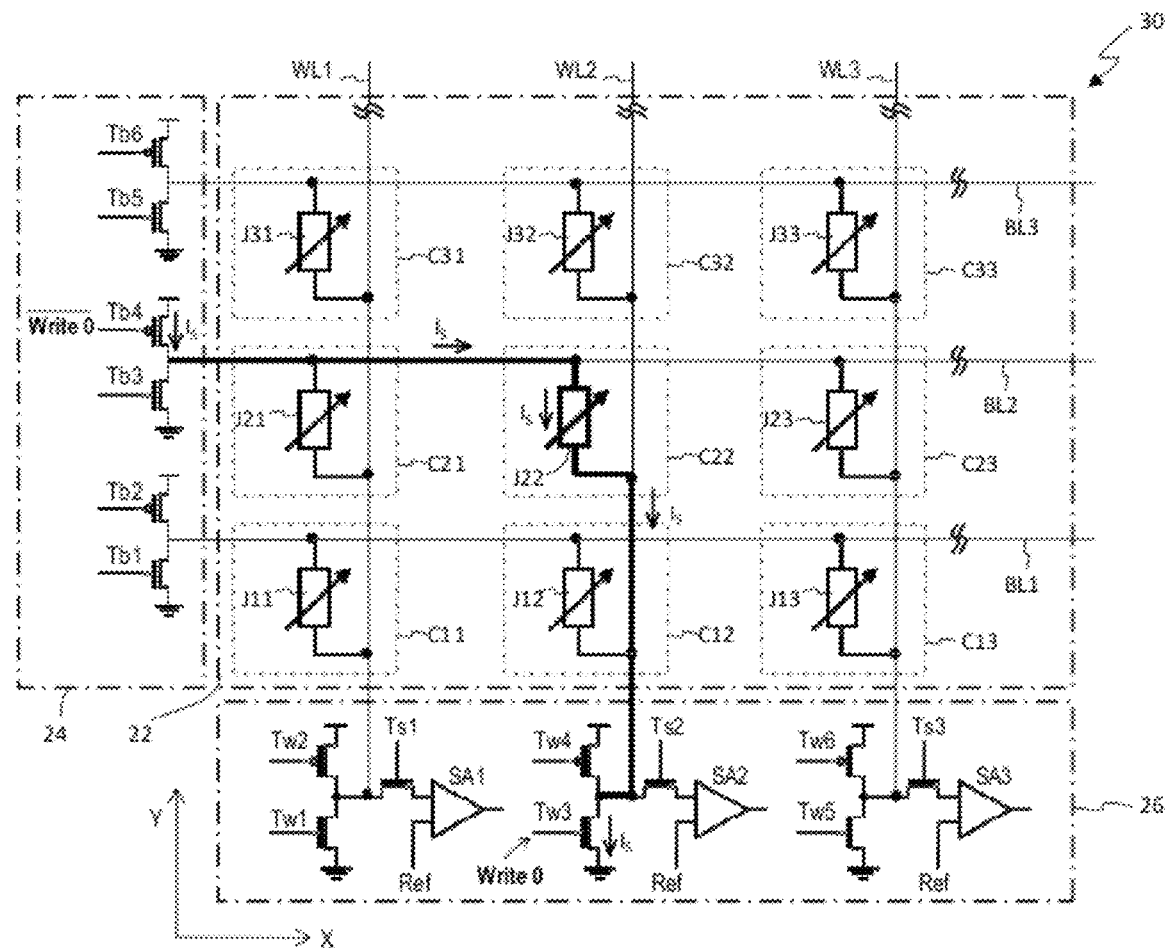
FIGS. 3A and 3B is a circuit diagram of magnetic random access memory with a spin-induced switching according to an embodiment of the present disclosure illustrating writing of logic "0" and logic "1" to a memory cell.
Figure 3B:
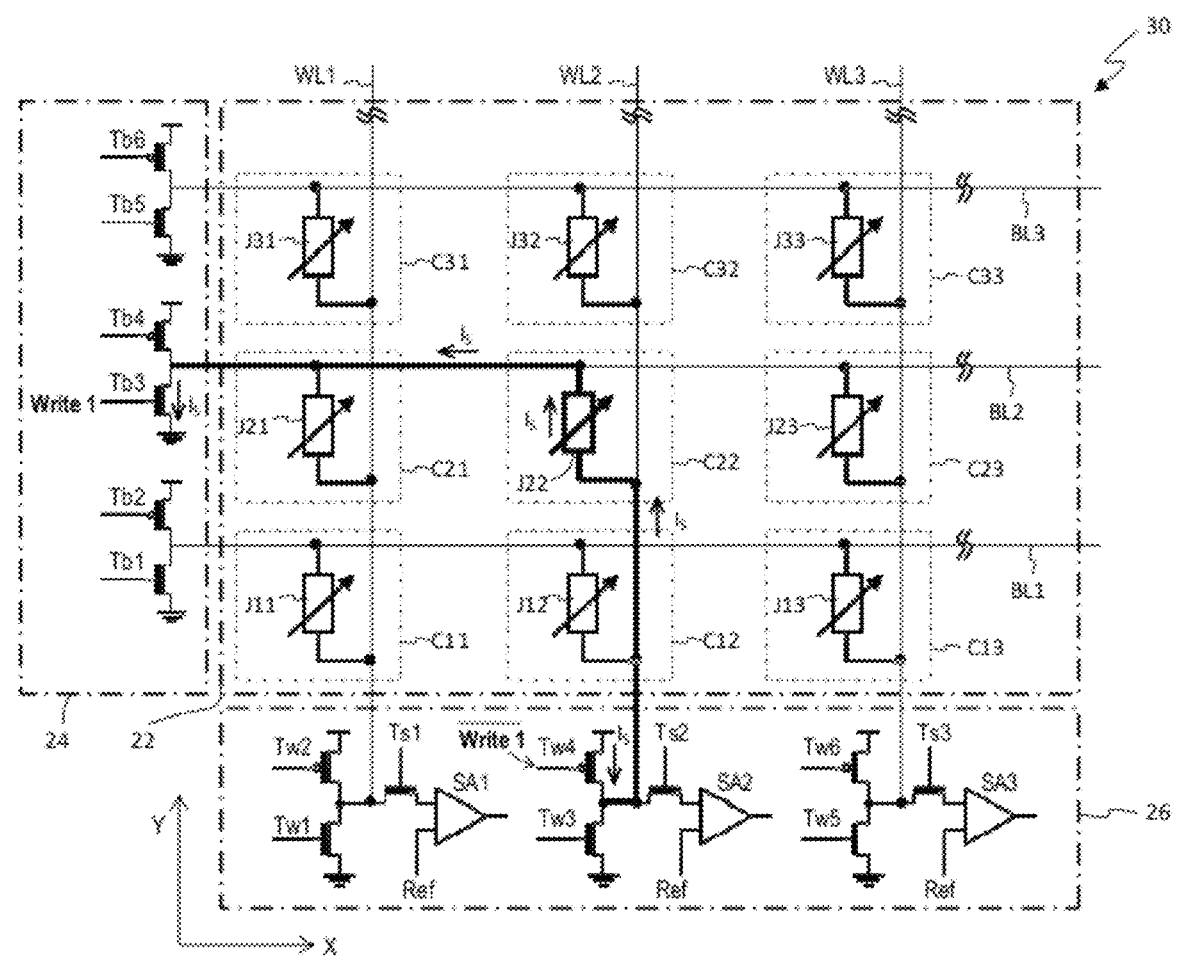

FIGS. 3A and 3B show a circuit diagram of a portion of an MRAM 30 according to an embodiment of the present disclosure. The memory includes an array 22 of memory cells C11-C33, a plurality of parallel bit lines BL1-BL3 connected at their end to a bit line driver 24, and a plurality of parallel word lines WL1-WL3 connected at their end to word line driver 26.

Each memory cell comprises an MR element without a selection transistor. The MR element is connected to the appropriate bit and word lines at its ends and disposed at the intersection of the lines in a vertical space between them. A schematic view of the memory cell of the MRAM 30 is shown on FIG. 4. The MR element J has a pillar structure and comprises at least a pinned magnetic layer 12 having a fixed magnetization direction (shown by a solid arrow), a free magnetic layer 16 having a variable (or reversible) magnetization direction (shown by a dashed arrow), and a tunnel barrier layer 14 disposed between the pinned and free magnetic layers. The free magnetic layer 16 can be made of a magnetic material with a substantial spin-polarization and has a the magnetization directed substantially perpendicular to a layer surface in its equilibrium state. For example, the free magnetic layer 16 can be made of $(Co_{30}Fe_{70})_{85}B_{15}$ (% atomic) alloy having a thickness of about 1.5 nm. The pinned magnetic layer 12 can be made of a magnetic material with a substantial spin-polarization and has the magnetization directed substantially perpendicular to a layer surface. For example, the pinned magnetic layer can be made of the $(Co_{30}Fe_{70})_{85}B_{15}$ (% atomic) alloy having a thickness of about 2.5 nm. The tunnel barrier layer 14 can be made of MgO having a thickness of about 1.1 nm. The free, tunnel barrier and pinned layers form a substantially coherent texture having a BCC (body-centered cubic) structure with (001) plane orientation. The MR element with this crystalline structure provides a substantial tunneling magnetoresistance (TMR≥100% at room temperature) and a density of spin-polarized write current of about $1 \cdot 10^6$ A/cm$^2$ or less. These parameters are essential for MRAM.

In the MRAM 30 shown in FIGS. 3A and 3B the pluralities of the conductive bit and the word lines intersect each other but are spaced from each other in direction perpendicular to a plane of substrate (not shown). Each of the memory cells C11-C33 comprises an appropriate MR element J11-J33 that is disposed at an intersection of a bit and word line in the vertical space between them. The MR element is electrically connected to the intersecting bit and word lines at its opposite ends. For instance the memory cell C22 comprises the MR element J22 disposed at the intersection of the bit line BL2 and the word line WL2. The MR element J22 is electrically connected to the word line WL2 at its first end and to the bit line BL2 at its second end.

The bit lines BL1-BL3 extend in the X-direction. They are electrically connected at one end to a bit line driver 24 that includes CMOS transistors Tb1-Tb6. For example, the bit line BL2 is connected at one end to a common drain terminal formed by an n-type transistor Tb3 and p-type transistor Tb4. A source terminal of the p-type transistor Tb4 is connected to a power supply. A source terminal of the n-type transistor Tb3 is connected to a ground. Similarly the bit lines BL1 and BL3 are connected to the pairs of CMOS transistors Tb1, Tb2 and Tb5, Tb6, respectively. Gate terminals of the transistors Tb1-Tb6 are connected to the bit line driver 24. The bit line driver 24 operates as a row selection switch.

The word line WL1-WL3 extend in the Y-direction crossing the X-direction. One end of each word line WL1-WL3 is connected to the word line driver 26. The driver 26 comprises a plurality of read/write circuits. Each of the read/write circuits includes at least a pair of CMOS transistors comprising one of p-type transistors Tw2, Tw4 or Tw6 and one of n-type transistors Tw1, Tw3 or Tw5 connected in series to each other, and one of a sense amplifiers SA1-SA3. Each of the transistors pairs Tw1 and Tw2, Tw3 and Tw4, and Tw5 and Tw6 is connected to a power supply at a source terminal of the appropriate p-type transistor and to the ground at a source terminal of the appropriate n-type transistor. The word line is connected to a common drain terminal of the CMOS transistor pair and to one input terminal of the sense amplifier SA through a read transistor Ts. For example, the word line WL2 is connected by its end to the common drain terminal formed by the transistor Tw3 and Tw4 and to the first input terminal of the sense amplifier SA2 through the read transistor Ts2. Second input terminal of the sense amplifier SA2 is connected to a reference element (not shown). Gates of the transistors Tw1-Tw6 are connected to the word line driver 26. The driver 26 operates as a column selection switch.

The sense amplifier SA1-SA3 comprises at least two inputs. One input of the amplifier is connected to the end of the word line WL1-WL3 and to the common drain terminal of the transistor pair by means of the read transistor Ts1-Ts3. The other input of the sense amplifier is connected to a reference element (not shown). The sense amplifier judges a data value of the MR element inside of the selected memory cell based on a reference signal Ref.

The memory 30 shown in FIGS. 3A and 3B comprises the array 22 of the MR elements J11-J33 disposed above the silicon wafer (not shown). The selection transistors Tb1-Tb6 and Tw1-Tw6 may be positioned along a perimeter of the array 22. The wafer area located underneath of the memory array may not be occupied by the selection transistors and can be used for other electrical circuits. Hence, the present design can provide a substantial reduction of a chip/die size. Moreover, the peripheral location of the selection transistors provides a possibility of using large selection transistors or several transistors providing a substantial write current that is essential for high speed writing.

The MRAM 30 shown in FIGS. 3A and 3B employs a spin-induced switching mechanism of the MR elements. According to spin-induced switching the orientation of magnetization in the free layer 16 can be reversed by a spin-polarized current $I_S$ running through the MR element (FIG. 4). Electrons of the write current have a substantial degree of spin polarization that is predetermined by magnetic properties of the pinned layer 12. The spin-polarized electrons running through the free layer 16 transfer a moment of their spin causing the magnetization in the free layer to change its direction. Direction of the magnetization in the free layer 16 can be controlled by a direction of the spin-polarized current $I_S$ running through the MR element. The direction of the spin-polarized current in the MR element shown on FIG. 4 corresponds to writing a logic "0" or to parallel orientation of magnetization directions in the free 16 and pinned 12 magnetic layers.

FIG. 3A shows writing of a logic "0" to the MR element J22 of the memory cell C22. A switching current $I_S$ is produced in the MR element by applying appropriate input signals to the gate of the transistor Tb4 (Write 0) and to the gate of the transistor Tw3 (Write 0). Both transistors are opened.

The spin-polarized current $I_S$ is running from the power supply (not shown) through the transistor Tb4, bit line BL2, MR element J22, word line WL2, and transistor Tw3 to the ground. The appropriate bit and word lines, and MR element are shown in bold. For the MR element having a configuration shown in FIG. 4 the current $I_S$ is running in the direction from the free layer 16 to the pinned layer 12 through the tunnel barrier layer 14. The spin-polarized conductance electrons are moving in the opposite direction from the pinned layer 12 to the free layer 16. For the given direction of the current $I_S$, the magnetization in the free layer 16 will be directed in parallel to the magnetization direction of the pinned layer 12. This mutual orientation of the magnetizations corresponds to a low resistance state of the MR element or to a logic "0".

FIG. 3B illustrates writing logic "1" to the MR elements J22. The write current $I_S$ is supplied to the MR element J22 by simultaneously applying an appropriate input signal to the gate of the transistors Tb3 (Write 1) and Tw4 (Write 1). The transistors are opened and the current $I_S$ is running from the transistor Tw4 to the transistor Tb3 through the word line WL2, MR element J22, and bit line BL2 (shown in bold). In the MR element J22 having a configuration shown in FIG. 4 the spin-polarized current $I_S$ is running in the direction from the pinned layer 12 to the free layer 16. This direction of the spin-polarized current can direct the magnetization in the free layer 16 anti parallel to the magnetization direction of the pinned layer 12. This mutual orientation of the magnetizations corresponds to a high resistance state or to a logic "1".

According to theory, the magnitude of the minimum spin-polarized current that is required to reverse the magnetization direction in the free layer is given by $$I_{G_0} = -\frac{\left(\frac{2e}{h}\right)(\alpha M_S V)}{g(\theta)p} H_{EFF} \qquad (1)$$

where e is an electron charge, h is Planck's constant, $\alpha$ is Gilbert's damping constant, $M_S$ is saturation magnetization of the free layer material, V is volume of the free layer, and p is a spin polarization of the current. The factor $g(\theta)$ depends on the relative angle $\theta$ between vectors of magnetization (shown by arrows in FIG. 4) in the pinned 12 an free 16 layers. The value of the factor $g(\theta)$ is minimal and close to zero when the vectors of the magnetizations in the free and pinned layers are parallel or anti parallel to each other ($\theta$ is equal to 0 or 180 degrees). The factor $g(\theta)$ has its maximum value when the vectors of magnetizations in the layers are perpendicular to each other (the angle $\theta$ is equal to 90 or 270 degrees). The effective magnetic field $H_{EFF}$ acting on the free layer depends on the direction of magnetization (in-plane or perpendicular) in the pinned and free layers. The effective field is given by the following equations for the in-plane and for perpendicular magnetic materials, respectively:

$$H_{EFF//} = H_{K//} + 2\pi M_S + H_{APP} + H_{DIP} \qquad (2)$$

$$H_{EFF\perp} = H_{K\perp} - 4\pi M_S + H_{APP} + H_{DIP}, \qquad (3)$$

where $H_{K//}$ and $H_{K\perp}$, are the field of uniaxial crystalline anisotropy of in-plane and perpendicular magnetic material, respectively; $H_{APP}$ and $H_{DIP}$ are the applied external field and the dipole field from the pinned layer acting on the free layer. The factor $-4\pi M_S$ arises from the demagnetizing field of the thin film geometry of the free layer having the perpendicular anisotropy. The same factor for the free layer with in-plane anisotropy is equal to $+2\pi M_S$. Hence, the MTJ with perpendicular anisotropy may require substantially smaller (depends on $H_K$ and $M_S$) switching current than that with similar parameters but having the in-plane anisotropy.

The direction of the magnetization in the free layer 16 of the MR element in its equilibrium states can be parallel or anti-parallel to the magnetization direction in the pinned layer. At these conditions the switching current that is required to reverse the magnetization direction in the free layer has its maximum value. Moreover, the magnitude of the current depends significantly on the duration of the current pulse. The magnitude of the switching current is almost inversely proportional to the pulse duration. Hence, the high speed writing (short current pulse) requires high switching current. The magnitude of the switching current is limited by the probability of a tunnel barrier layer breakdown. The above obstacles limit switching speed and endurance of MRAM with spin-induced switching.

The equation (1) suggests that the spin-polarized write current can be reduced significantly by changing the angle $\theta$ between the vectors of the magnetization in the free and pinned layers. Since the orientation of magnetization in the pinned layer 12 is fixed, the angle $\theta$ can be changed by tilting the magnetization in the free layer 16 from its equilibrium state. Tilting of the magnetization of the free layer 16 can be provided by applying a bias magnetic field along a hard magnetic axis of the free layer 16.

FIG. 5 shows a schematic view of the memory cell comprising an MR element with perpendicular magnetization in the pinned 12 and free 16 magnetic layers along with adjacent bit BL and word WL lines. In addition to the spin-polarized switching current $I_S$ a bias current $I_B$ is further supplied to the bit line BL. The bias current $I_B$ running through the bit line BL produces a bias magnetic field $H_B$ (shown by arrow) that is applied along the hard axis of the free layer 16. To increase the bias magnetic field locally, in vicinity of the MR element for further reducing the bias current $I_B$, the bit line BL comprises a conductive wire 52 and a magnetic flux concentrator (magnetic flux cladding) 54. The magnetic flux concentrator 54 is made of a soft magnetic material having a high permeability and a low coercivity such as NiFe. The flux concentrator 54 comprises a non-magnetic gap 56 formed on a side of the bit line BL facing the MR element. The free layer 16 is disposed adjacent to the non-magnetic gap 56 where the bias magnetic field $H_B$ has a maximum. Additional layers, such as a seed layer can be placed between the free layer 16 and the bit line BL. Insertion of the additional layer (or layers) between the free magnetic layer 16 and the bit line BL can result in a reduction of the bias field. The magnetic field $H_B$ decreases almost inversely proportional with the distance between the free layer 16 and the bit line surface containing the non-magnetic gap 56. FIG. 5 illustrates one exemplary implementation where a magnetic cladding is wrapped around a bit line that carries the bias current. Other magnetic flux cladding designs may also be used. The magnetic flux cladding can be used for a word line as well.

The bias magnetic field $H_B$ generated by the bias current $I_B$ is proportional to the current. For example, a current of 0.1 mA can generate a bias magnetic field of about 10 Oe in the vicinity of the MR element made with 65 nm technology node. This magnitude of the bias field $H_B$ is not sufficient to cause an unwanted reversal of the magnetization in the memory cells exposed to the bias field. The reversal of the magnetization can be achieved when both the bias magnetic field $H_B$ and spin-polarized current $I_S$ affect the selected MR element simultaneously. Hence the proposed hybrid writing mechanism provides a good selectivity of the MR elements in the array and significant reduction of the spin-polarized current $I_S$. That is important for achieving a high endurance of MRAM operating at high speed, especially.

Figure 6A:
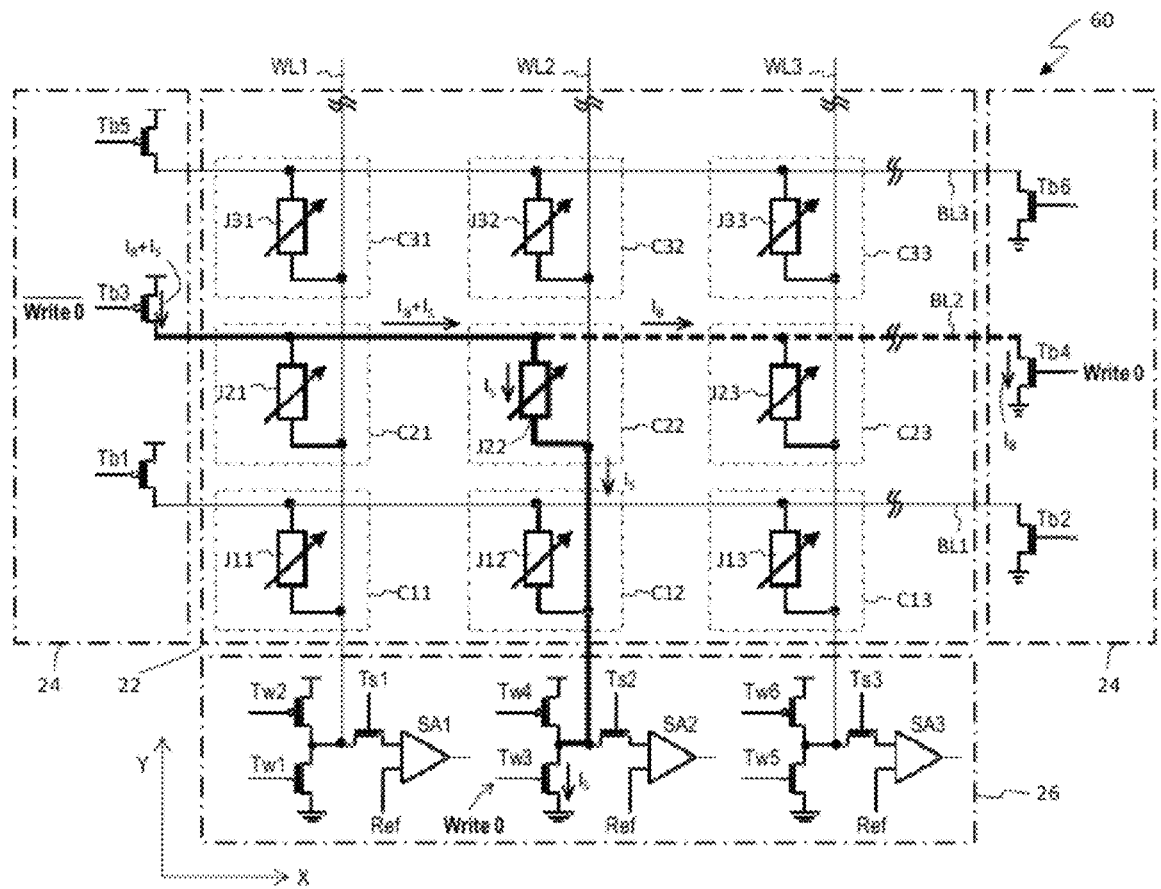
FIG. 6A is a circuit diagram of magnetic random access memory with a hybrid switching mechanism illustrating writing a logic "0" to a memory cell according to another embodiment of the present disclosure.
Figure 6B:
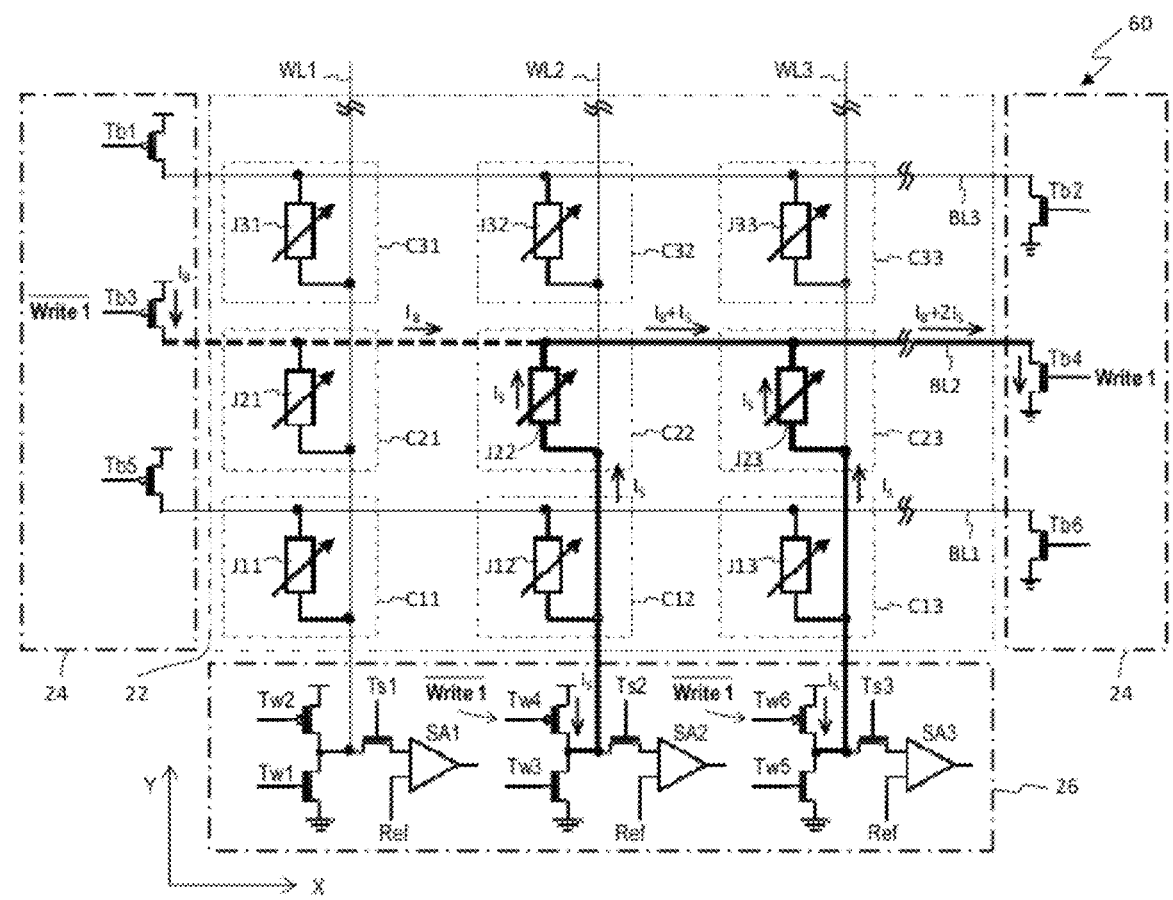
FIG. 6B is a circuit diagram of magnetic random access memory with a hybrid switching mechanism illustrating writing logic "1" to several memory cells simultaneously according to another embodiment of the present disclosure.

FIGS. 6A and 6B show a circuit diagram of a portion of MRAM 60 employing a hybrid write mechanism. The memory 60 comprises the bit line driver 24 connected to the opposite ends of the bit lines BL1-BL3. The word lines WL1-WL3 are connected at one end to the word line driver 26.

To write a logic "0" to the MR element J22 (FIG. 6A) a bias current $I_B$ is supplied to the bit line BL2 by applying an appropriate input signal to the gate of transistor Tb3 (Write 0) and to the gate of the transistor Tb4 (Write 0). The bias current $I_B$ running through the bit line BL2 produces a bias magnetic field that is applied along the hard axis of the free layer. The bias field causes a tilt of the magnetization vector in the free layer from its equilibrium state that is perpendicular to the film surface. The magnitude and duration of the bias magnetic field can be controlled effectively by the input signal "Write 0" and "Write 0" applied to the gate of the transistor Tb3 and Tb4 respectively. The bias current $I_B$ alone cannot cause a reversal of the magnetization direction in the MR element J22 and adjacent to the bit line BL2 elements J21 and J23. Switching of the magnetization direction in the free layer is a joint effect of the bias magnetic field and a spin momentum transfer of polarized electrons of the current $I_S$ running through the MR element. To cause switching the spin-polarized current $I_S$ is supplied to the MR element J22. The current $I_S$ is running from the transistors Tb3 to the transistor Tw3 through the MR element J22 located at the intersection of the bit line BL2 and word line WL2 (shown in bold). Simultaneous effect of the bias magnetic field and spin-polarized current results in a logic state reversal of the MR element J22.

The input signals applied to the gate of the transistors Tb3, Tb4, and Tw4 are synchronized in time. Pulses of the currents $I_B$ and $I_S$ can overlap each other partially (shifted in time) or completely. The order of the pulses at partial overlapping can be any. The transistor Tb4 should be opened while any of the transistors Tb3 or Tw4 are opened.

The memory 60 also provides a possibility of simultaneous writing to the several MR elements having electrical contact with the energized bit line BL2 (FIG. 6B). The bias current is supplied to the bit line BL2 by applying an appropriate input signal to the gate of the transistors Tb3 (Write 1) and Tb4 (Write 1). The bias current $I_B$ produces a bias magnetic field along the entire line and tilts the direction of the magnetization in all MR elements adjacent to the bit line. This field is not sufficient to cause a reversal of the magnetization directions in the energized MR elements. To accomplish reversal a spin-polarized current needs to be applied to the element. FIG. 6B shows a circuit diagram of a portion of memory 60 during writing logic "1" to the memory cells C22 and C23 simultaneously when a bias current is applied to the line BL2. The appropriate input signals "Write 1" are applied to the gate of the transistors Tw4 and Tw6 connected to the end of the word lines WL2 and WL3, respectively. The MR elements J22 and J23 located at the intersection of the word lines WL2 and WL3 with a bit line BL2 are exposed to the cumulative effect of the bias magnetic field produced by the bias current $I_B$ and spin-polarized current $I_S$ running through the elements.

Data can be written to the memory cells C21, C22, and C23 at the same time by applying an appropriate signal to the gate of the transistors Tw1 or Tw2, Tw3 or Tw4, and Tw5 or Tw6. Simultaneous writing to several memory cells can provide significant reduction of a write energy per bit by means of more effective use of the bias current.

The transistors Tb1-Tb6 connected to the bit lines BL1-BL3 and the transistors Tw1-Tw6 connected to the word lines WL1-WL3 are exposed to different magnitudes of the current running through them during writing. Therefore they can have different saturation currents that can be achieved by using different size of transistors or by using several transistors. For instance the transistors Tb1-Tb6 can have higher saturation current than the transistors Tw1-Tw6. The transistors Tw1-Tw6 control the switching spin-polarized current in the MR elements of the array 22.

Figure 7:
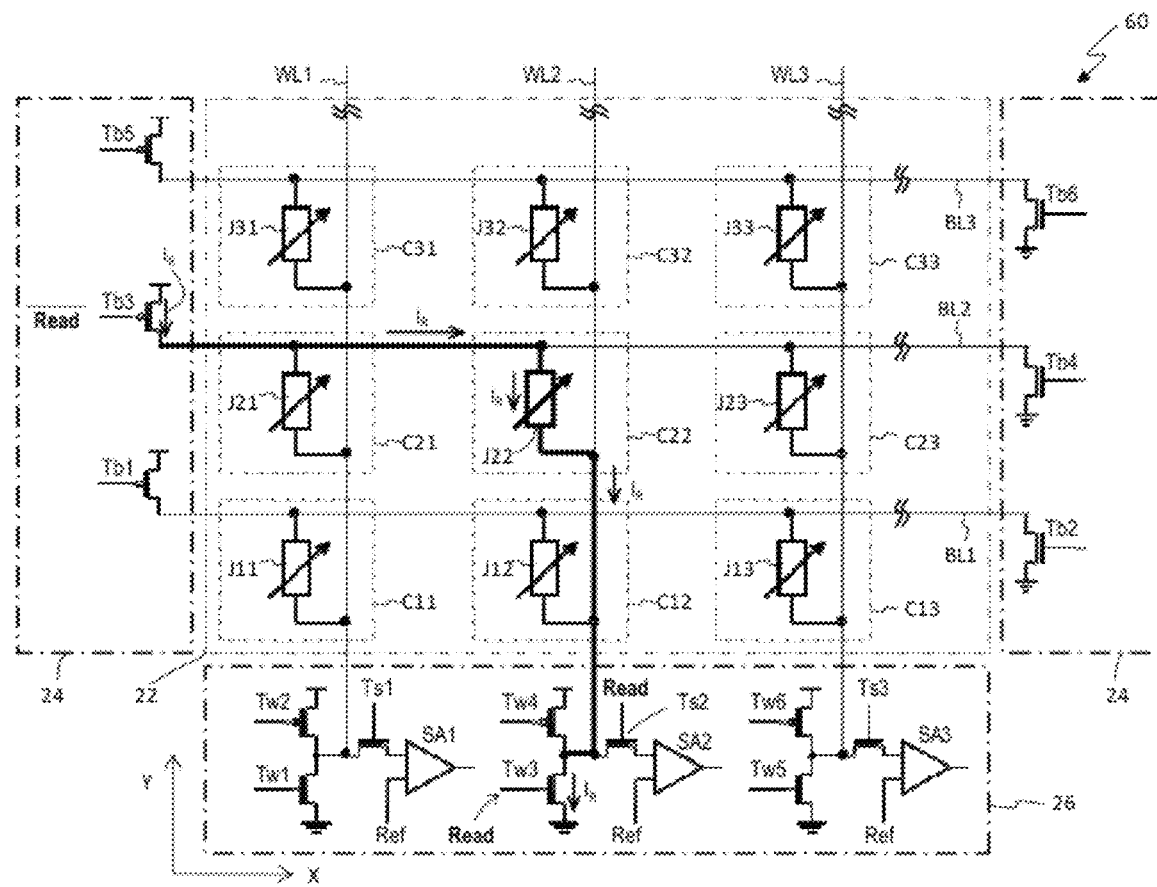
FIG. 7 is a circuit diagram of the magnetic random access memory shown in FIG. 6A during a read operation.

FIG. 7 shows a circuit diagram of the memory 60 according in the read mode of operation. To read the data stored in the memory cell C22 an appropriate input signal is applied to the transistors Tb3 (Read), Tw3 (Read), and Ts2 (Read). A signal produced by a read current $I_R$ running through the MR element J22 represents a read signal that is proportional to the resistance of the MR element: high resistance for logic "1" and a low voltage for logic "0". The read current $I_R$ is smaller than the spin-polarized write current $I_S$ and cannot cause the reversal of the magnetization in the free layer of the MR element J22 specifically due to absence of the bias magnetic field. The read signal is applied to one input of the sense amplifier SA2 through the opened transistor Ts2. A reference read signal Ref from a reference memory cell (not shown) is applied to another input of the sense amplifier SA2. The output of the sense amplifier SA2 provides information about the data stored in the memory cell C22.

The MR elements of the disclosed MRAMs can use magnetic materials with in-plane and/or perpendicular direction of the magnetization in the equilibrium state. Magnetic materials exhibiting in-plane magnetization direction may have an uniaxial magneto-crystalline anisotropy that is not sufficient to provide a required thermal stability. To overcome this disadvantage the MR element employing in-plane magnetic materials (in-plane MR elements) can use a shape anisotropy in addition to the magneto-crystalline anisotropy. For that reason the MR element (or the free layer only) can have a shape of an elongated ellipse with an easy axis of the magneto-crystalline anisotropy oriented along a major axis of the ellipse. The ratio between the minor and major axis of the elliptical MR element can vary in the range from about 1:1.1 to about 1:5 depending on the technology node F of the manufacturing process. Frequently the technology node F can be equal to the size of the minor axis of the MR element. For example, the MR elements built using the technology node F=65 nm can have the ratio between the minor and major axis of about 1:2. It means, that lengths of the minor and major axis of the MR element are 65 nm and 130 nm, respectively.

Magnetic materials exhibiting a perpendicular magnetization direction usually have a substantial uniaxial magneto-crystalline anisotropy that can be significantly higher than that of the in-plane magnetic materials. For that reason the perpendicular MR elements having any shape, including round, can provide the required thermal stability.

Figure 8A:
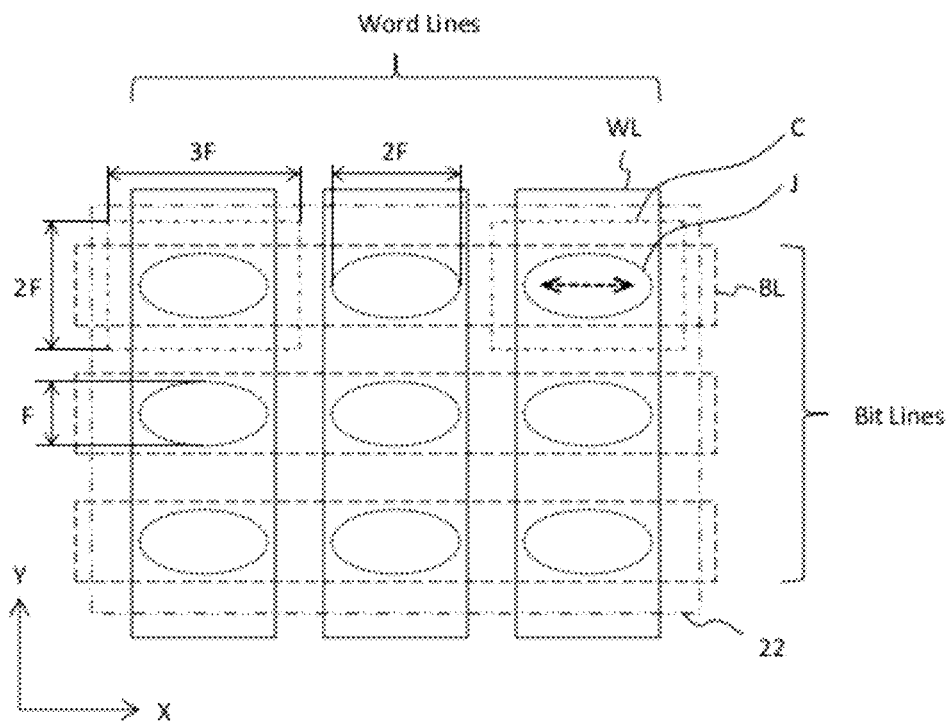
FIGS. 8A and 8B are plane and cross sectional views of the MR elements made of in-plane magnetic materials, respectively.
Figure 8B:
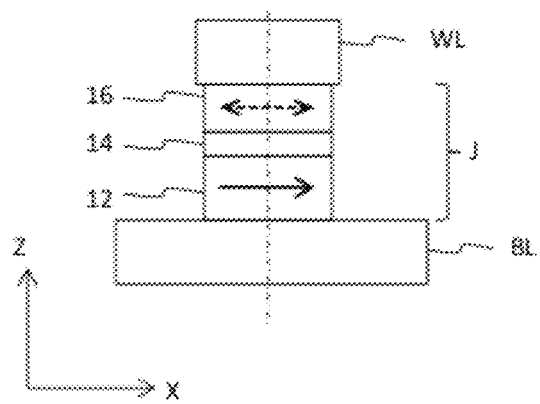

FIGS. 8A and 8B show plane and cross-sectional views of the MR elements made of the in-plane magnetic materials, respectively. The major axis of the elliptical MR element J and the easy axis of the magnetic anisotropy (shown by an arrow) of the free 12 and pinned 16 magnetic layers are oriented in parallel to each other and to the bit line BL, as well. In the given exemplary embodiment the bit line BL is used to carry a bias current $I_B$. The bias current running through the bit line BL can produce a bias magnetic field $H_B$ that is applied along the hard magnetic axis of the free layer (along the minor ellipse axis). The bias magnetic field $H_B$ can tilt the magnetization direction of the free layer 12 from its equilibrium state. That can result in a reduction of the spin-polarized switching current $I_S$ required for writing to the MR element J. The elliptical shape of the in-plane MR element J may cause a cell size increase. For instance, in the given exemplary embodiment shown in FIG. 8A the cell size is about of 6 $F^2$.

Figure 9A:
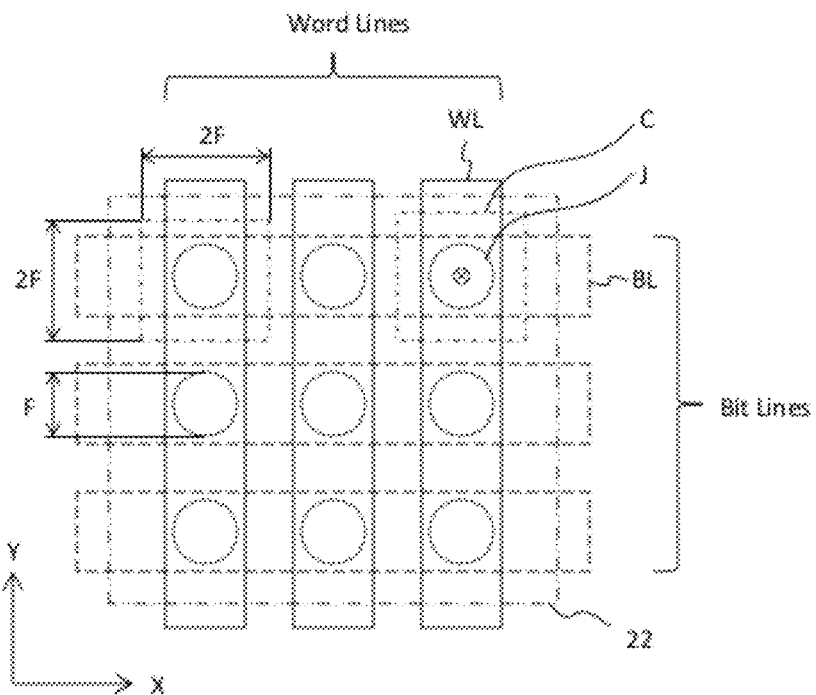
FIGS. 9A and 9B are plane and cross sectional views of the MR elements made of perpendicular magnetic materials, respectively.
Figure 9B:
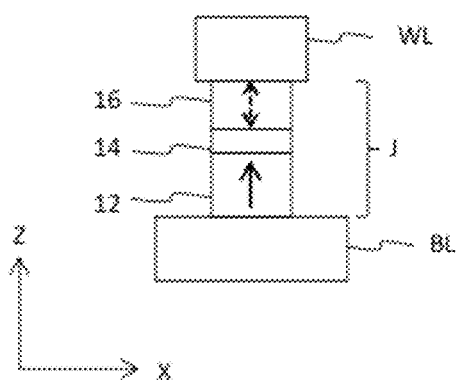

MR elements made of magnetic materials with a perpendicular magnetization direction (anisotropy) are shown in FIGS. 9A and 9B. The perpendicular MR element J can be formed in a round shape providing similar or higher thermal stability than the in-plane MR element having a similar thickness of the free layer and made with the same technology node F. A size of the perpendicular memory cell C can be of about 4 $F^2$. Hence, the perpendicular MR elements can provide a substantial increase of the memory cell density along with a reduction of the write current.

Figure 10:
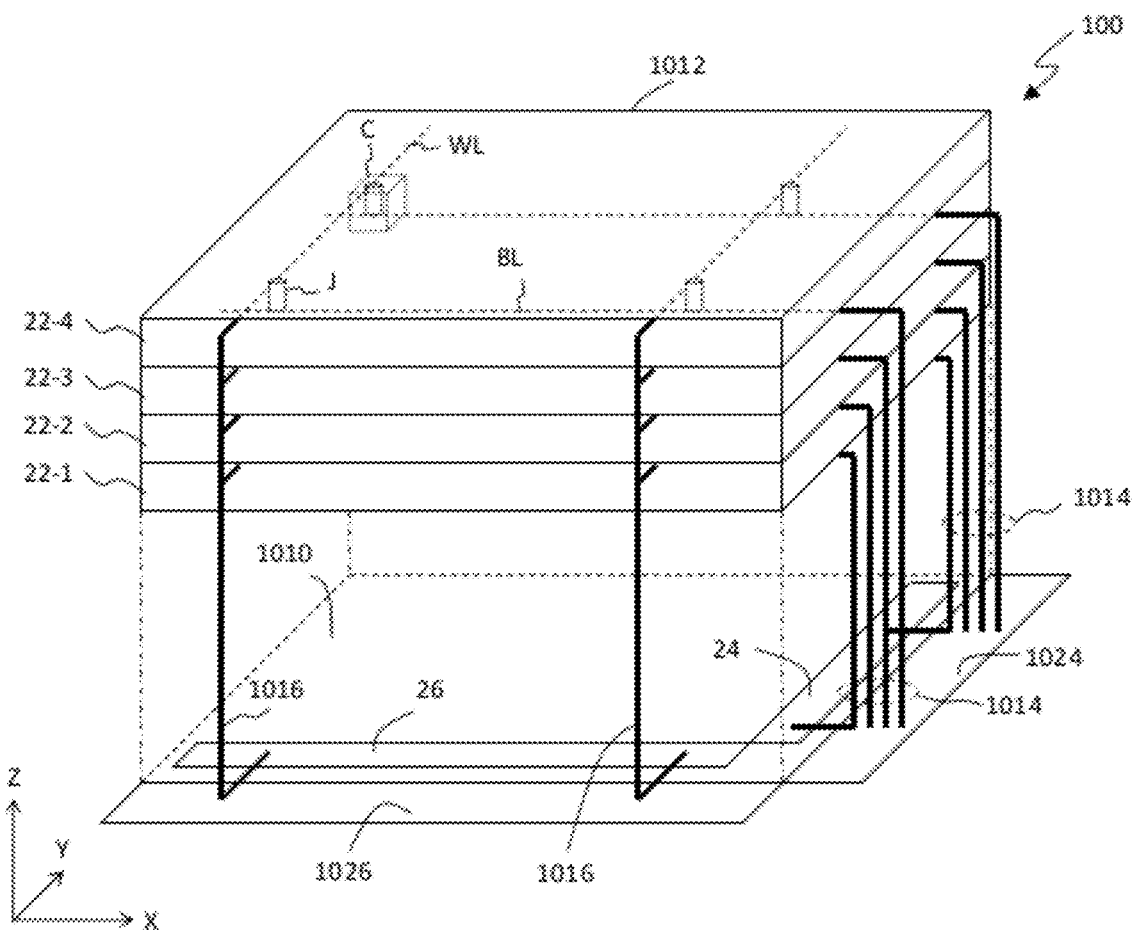
FIG. 10 is a 3D-configuration of a magnetic memory employing a spin-induced switching mechanism according to an embodiment of the present disclosure.

The arrays 22 of the memory cells shown in FIG. 8A and FIG. 9A can be arrange in a three dimensional (3D) configuration. FIG. 10 shows a 3D-configuration of the magnetic memory 100 employing two-dimensional (2D) magnetic memory 30 with spin-induced switching (FIGS. 3A and 3B). In the given exemplary embodiment the 3D-MRAM 100 includes a substrate (not shown) comprising a control circuitry area 1010 for use in formation of column-related and row-related control circuits therein, and a memory block 1012 stacked thereon.

The memory block 1012 includes four layers of the memory cell arrays 22-1, 22-2, 22-3, and 22-4 stacked one above another in the vertical direction (Z-direction) above a semiconductor substrate (or wafer). The layers of the memory cell arrays are electrically isolated from each other by insulator layers (not shown). Note that the number of the memory cell arrays in the block 1012 can be any. Each of the memory cell arrays 22-n comprises magnetic memory cells C arranged in rows and columns. The memory cell C can use a MR element J employing magnetic materials with in-plane (FIGS. 8A and 8B) or perpendicular (FIGS. 9A and 9B) magnetization direction (anisotropy).

As shown in FIG. 10, the control circuitry area 1010 is formed on the semiconductor substrate (not shown) immediately beneath the memory block 1012. The control circuitry area 1010 can include a row-related control circuitry comprising a bit line driver 24, and a column-related control circuitry comprising a column driver 26.

Connections of the bit lines BL and the word lines WL in the stacked memory cell arrays 22-n to the drivers 24 and 26, respectively require vertical conductive lines (via-contacts or interconnects) located on the sides of the memory block 1012. The bit lines BL can have one end connected to the bit line driver 24 by means of the vertical bit line interconnects 1014 that can be formed in a bit line interconnect contact area 1024. Respectively, the word lines WL can have one end connected to the word line driver 26 by vertical word line interconnects 1016 formed in a word line contact area 1026. The interconnect contact areas 1024 and 1026 can be provided along two sides of the control circuit area 1010. For example, the bit line interconnect contact area 1024 can be located along a side that is parallel to Y-direction, and the word line interconnect contact area 1026 can be located along a side of the control circuit area 1010 that is parallel to X-direction.

Figures 11A, 11B:
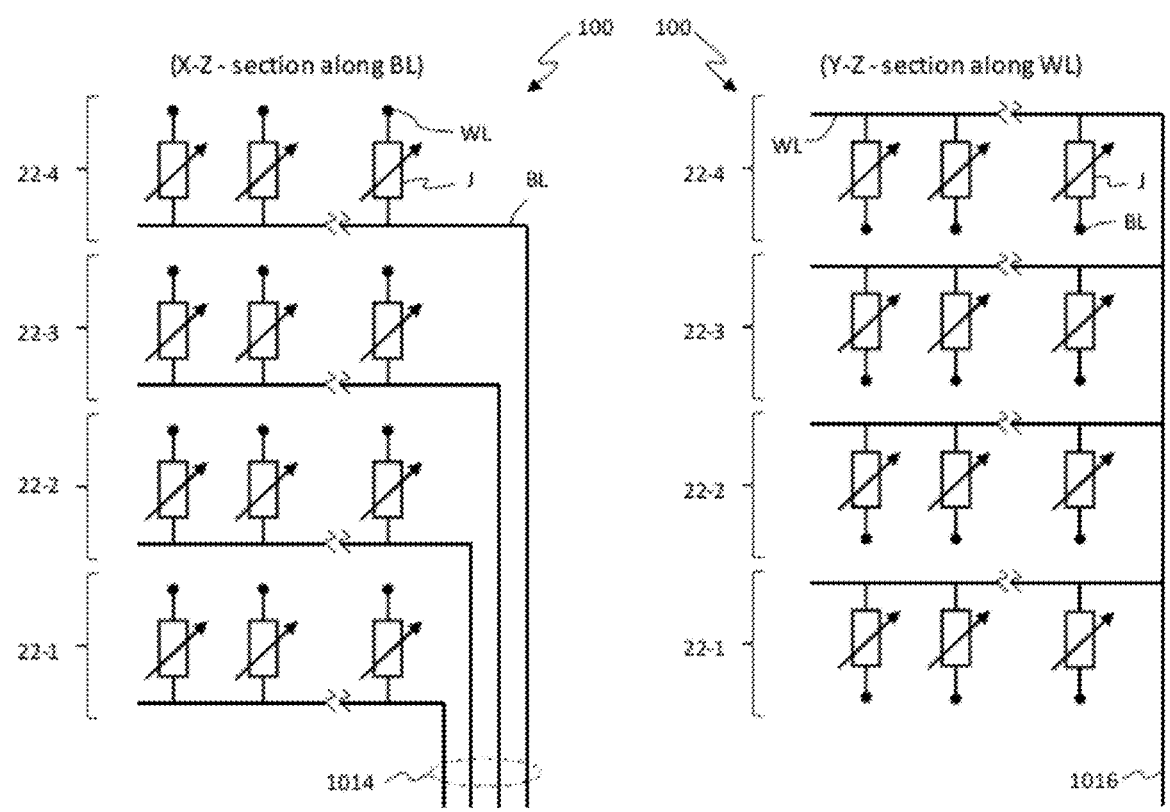
FIGS. 11A and 11B illustrate a configuration of bit lines and word lines shared by cell arrays in a memory block shown in FIG. 10 and the relation between bit line interconnects and word line interconnects.

The configuration of the bit lines BL and word lines WL shared by the cell arrays 22-1-22-4 in the memory block 1012 and the relation between the bit line interconnects 1014 and the word line interconnects 1016 are described with reference to FIGS. 11A and 11B. FIG. 11A is an X-Z-sectional view of the memory block 1012 taken along a bit line BL. FIG. 11B shows an Y-Z-sectional view of the memory block 1012 taken along a word line WL. FIGS. 11A and 11B show examples of the interconnects configured for the bit lines BL and word lines WL.

As shown in FIG. 11A, each bit line of the memory cell arrays 22-1 through 22-4 can be independently connected to the bit line driver 24 (FIG. 10) by means of a separate vertical bit line interconnect 1014. Each bit line can be electrically coupled to the driver 24 at one of its ends through the interconnect 1014. In some circumstances, a bit line may be connected to the bit line driver 24 by several interconnects to maintain an uniform signal along a length of the line. The given configuration provides a possibility of an individual selection of the bit lines in the memory block 1012.

FIG. 11B illustrates a configuration of the word lines in the memory block 1012. In the given exemplary embodiment one word line of each of the memory cell arrays 22-1 through 22-4 can be electrically coupled to an appropriate word line interconnect 1016. The four word lines can be coupled in common to the interconnect 1016 at one of their ends. In some circumstances, to supply an uniform value of the signal along the entire length of the word lines; the lines can be coupled to the word line driver 26 (FIG. 10) by two or more interconnects 1016. One word interconnect line 1016 can provide a simultaneous electrical coupling to the word line drive 26 of four word lines. The word line interconnect 1016 can run through all memory cell arrays 22-1 through 22-4.

Selection of a memory cell (MR element) in the memory block 1012 can be achieved by applying appropriate signals to one bit interconnect line 1014 and to one word interconnect line 1016. The selected memory cell is located at the intersection of the activated bit and word lines. An operation of the 3D-memory 100 is similar to the operation of the 2D-memory 30 disclosed above (FIGS. 3A and 3B).

During writing a logic "0" to the selected MR element J22 (FIG. 3A), non-selected elements J21, J23 and others which are electrically connected to the energized bit line BL2 may change their logic state due to a spin-polarized leakage current through them to the ground. To prevent the unwanted writing to the non-selected MR elements the word line driver 26 can apply an intermediate voltage to these elements. The value of the intermediate voltage is less than that of the power supply but higher than the ground voltage. The intermediate voltage can reduce the spin-polarized leakage current in the non-selected MR elements to the value that is less than the current necessary to reverse the magnetization direction in a free layer. This method can be used during a read operation (FIG. 7).

During writing logic "1" (FIG. 3B) the intermediate voltage can be applied to the non-selected MR element J12, J32 and other coupled to the energized word line WL2 by the bit line driver 24.

In the given exemplary embodiment the bit lines BL can be independently driven on a layer basis while the word lines WL can be commonly connected in all the layers (one line per layer). Note that the word lines WL may also be independently driven on a layer basis. Alternatively, the bit lines BL may be commonly connected while the word lines WL are independently driven. The bit lines BL and the word lines WL may be configured such that at least one of them is shared by the upper and lower layers. In this case, the upper and lower memory cells in the arrays 22-n are arranged symmetric about the common line. The arrangement of the MR elements J is not limited to the shown example.

Figure 12:
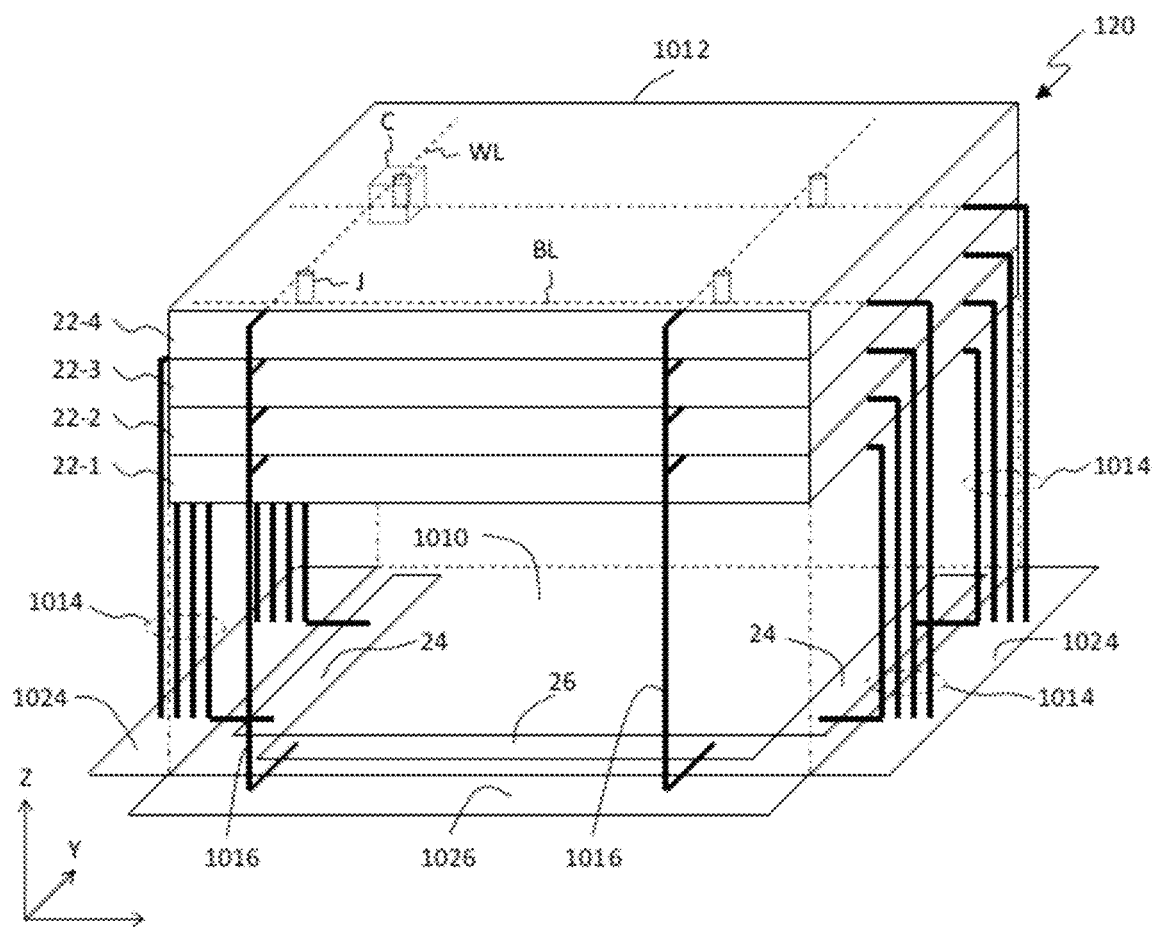
FIG. 12 illustrates a 3D-configuration of magnetic memory employing a hybrid writing mechanism according to another embodiment of the present disclosure

FIG. 12 shows another embodiment of the 3D magnetic memory according to the present disclosure. The magnetic memory 120 employs a hybrid writing mechanism that is disclosed above (FIGS. 6A and 6B). A configuration of the bit lines BL and word lines WL in the 3D-memory 120 is specified in FIGS. 13A and 13B that illustrate X-Z and Y-Z-sectional views taken along one of the bit lines and one of the word lines, respectively.

As in the 3D-memory 100, the bit lines BL in the memory 120 can be independently connected to the bit line driver 24 by means of the appropriate vertical bit line interconnects 1014 (FIG. 13A). More specifically, both ends each of the bit lines can be independently electrically coupled to the driver 24. The vertical bit line interconnects 1014 can be located on the opposite sides of the memory block 1012 along the Y-direction. The word lines WL of the 3D-memory 120 can have similar configuration as the word lines of the 3D-memory 100. Hence, the word lines WL in all the layers in one Y-Z-section can be commonly connected to an appropriate vertical word line interconnect 1016. An operation of the 3D-memory 120 is similar to the operation of the 2D-memory 60 (FIGS. 6A and 6B) described above.

During writing a logic "0" to the selected MR element J22 (FIG. 6A), non-selected magnetically biased elements J21, J23 and others which are electrically and magnetically coupled with the energized bit line BL2 may change their logic state due to a spin-polarized current leaking through them to the ground. To prevent the unwanted writing to the non-selected MR elements the word line driver 26 can apply the intermediate voltage to these elements. This approach can be used during writing logic "1" (FIG. 6B) for non-selected MR elements J12, J13, J21, J32, J33, and others.

While the specification of this disclosure contains many specifics, these should not be construed as limitations on the scope of the disclosure or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

It is understood that the above embodiments are intended to be illustrative, and not restrictive. Many other embodiments will be apparent to those of skill in the art upon reviewing the above description. The scope of the embodiments should be, therefore, determined with reference to the appended claims, along with the full scope of equivalents to which such claims are entitled.

While the disclosure has been described in terms of several exemplary embodiments, those skilled in the art will recognize that the disclosure can be practiced with modification within the spirit and scope of the appended claims. Specifically, one of ordinary skill in the art will understand that the drawings herein are meant to be illustrative, and the spirit and scope of the disclosure are not limited to the embodiments and aspects disclosed herein but may be modified.

What is claimed is:

1. A magnetic memory device, comprising:
   a substrate; and
   a stack of planar memory arrays disposed on a substrate surface, each memory array comprising a plurality of parallel first conductive lines, a plurality of parallel second conductive lines overlapping the first conductive lines at a plurality of intersection regions, a plurality of magnetic tunnel junctions, each magnetic tunnel junction being disposed at an intersection region, electrically coupled to one of the first conductive lines at a first terminal and to one of the second conductive lines at a second terminal, and comprising a controllable electrical resistance,
   wherein the electrical resistance of said each magnetic tunnel junction is controlled by a bidirectional spin-polarized current running between the first and second terminals in a direction perpendicular to the substrate surface.

2. The magnetic memory device of claim 1, wherein said each magnetic tunnel junction has a pillar structure and comprises:
   a free ferromagnetic layer disposed adjacent to the first terminal and comprising a reversible magnetization direction;
   a pinned ferromagnetic layer disposed adjacent to the second terminal and comprising a fixed magnetization direction; and
   an insulating tunnel barrier layer disposed between the free ferromagnetic layer and the pinned ferromagnetic layer.

3. The magnetic memory device of claim 2, wherein the electrical resistance of said each magnetic tunnel junction depends on a mutual orientation of the magnetization directions in the free and pinned ferromagnetic layers.

4. The magnetic memory device of claim 1, further comprising:
   an electrical circuitry disposed on the substrate beneath the stack of planar memory arrays; and
   a plurality of interconnects disposed adjacent to the stack of planar memory arrays,
   wherein the plurality of interconnects provides an electrical coupling of the plurality of first conductive lines and the plurality of second conductive lines to the electrical circuitry.

5. The magnetic memory device of claim 4, wherein each of the first conductive lines is separately eclectically coupled to the electrical circuitry by a separate interconnect.

6. The magnetic memory device of claim 4, wherein one of the second conductive lines of each of the plurality of planar memory arrays are electrically coupled in common to the electrical circuitry by a common interconnect.

7. A magnetic memory device, comprising:
   a substrate; and
   a plurality of planar memory arrays stacked on the substrate, each memory array comprising a plurality of parallel first conductive lines, each first conductive line comprising a ferromagnetic cladding, a plurality of parallel second conductive lines overlapping the first conductive lines at a plurality of intersection regions, a plurality of magnetic tunnel junctions, each magnetic tunnel junction comprising a controllable electrical resistance, being disposed at an intersection region and electrically coupled to one of the first parallel conductive lines at a first end and to one of the second parallel conductive lines at a second end,
   wherein the electrical resistance of said each magnetic tunnel junction is controlled by a joint effect of a bias magnetic field and a bidirectional spin-polarized current applied simultaneously to said each magnetic tunnel junction.

8. The magnetic memory device of claim 7, wherein said each magnetic tunnel junction comprises:
   a free ferromagnetic layer disposed adjacent to the first end and comprising a reversible magnetization direction;

a pinned ferromagnetic layer disposed adjacent to the second end and comprising a fixed magnetization direction; and an insulating tunnel barrier layer disposed between the free ferromagnetic layer and the pinned ferromagnetic layer, wherein the spin-polarized current is running between the first and second ends in a direction substantially perpendicular to a substrate surface.

9. The magnetic memory device of claim 7, wherein the bias magnetic field is produced by a bias current running along said one of the first parallel conductive lines and applied along a hard magnetic axis of the free ferromagnetic layer.

10. The magnetic memory device of claim 7, wherein the ferromagnetic cladding comprises a nonmagnetic gap disposed adjacent to said each magnetic tunnel junction.

11. A magnetic memory device, comprising:
a substrate;
a plurality of planar memory arrays vertically stacked on the substrate, each planar memory array comprising a plurality of parallel first conductive lines, a plurality of parallel second conductive lines overlapping the first conductive lines in a plurality of intersection regions, a plurality of magnetic tunnel junctions, each magnetic tunnel junction being disposed at an intersection region and comprising a free ferromagnetic layer having a reversible magnetization direction, a pinned ferromagnetic layer having a fixed magnetization direction, and a tunnel barrier layer disposed between the free ferromagnetic layer and the pinned ferromagnetic layer, said each magnetic tunnel junction being electrically coupled to one of the first conductive lines at a first terminal and to one of the second conductive lines at a second terminal;
a circuitry area disposed on the substrate beneath the plurality of planar memory arrays and comprising an electrical circuitry; and
a plurality of interconnects disposed adjacent to the circuitry area to provide an electrical coupling of the plurality of first conductive lines and the plurality of second conductive lines to the electrical circuitry,
wherein an electrical resistance of said each magnetic tunnel junction depends on a mutual orientation of the magnetizations directions in the free and pinned ferromagnetic layers.

12. The magnetic memory device of claim 11, wherein the magnetization directions of the free and pinned ferromagnetic layers are substantially parallel to the surface in their equilibrium states.

13. The magnetic memory device of claim 11, wherein the magnetization directions of the free and pinned ferromagnetic layers are substantially perpendicular to the substrate in their equilibrium states.

14. The magnetic memory device of claim 11, wherein the first terminal is disposed adjacent to the free ferromagnetic layer and the second terminals is disposed adjacent to the pinned ferromagnetic layer.

15. The magnetic memory device of claim 11, wherein each of the first conductive lines is independently electrically coupled to the electrical circuitry by a separate interconnect disposed adjacent to a first side of the circuitry area.

16. The magnetic memory device of claim 11, wherein one of the second conductive lines of a memory array is electrically connected in common with one of the second conductive lines of the other memory arrays, the connected second conductive lines are commonly electrically coupled to the electrical circuitry by a common interconnect which is disposed adjacent to a second side of the circuitry area which is orthogonal to the first side.

17. The magnetic memory device of claim 11, wherein the magnetization direction of the free ferromagnetic layer is reversed by a reversible spin-polarized current running between the first and second terminals in a direction substantially perpendicular to the substrate.

18. The magnetic memory device of claim 11, wherein each of the first conductive lines includes a ferromagnetic cladding comprising a nonmagnetic gap which is disposed adjacent to the free ferromagnetic layer.

19. The magnetic memory device of claim 18, wherein each of the first conductive lines is separately electrically coupled to the electrical circuitry by two separate interconnects.

20. The magnetic memory device of claim 18, wherein the magnetization direction of the free ferromagnetic layer is reversed by a joint effect of the spin-polarizing current and a bias current, the bias current is running along a first conductive line to generate the bias magnetic field directed along a hard axis of the free ferromagnetic layer.

* * * * *